United States Patent
Deppe

(10) Patent No.: US 10,033,156 B2
(45) Date of Patent: Jul. 24, 2018

(54) LOW RESISTANCE VERTICAL CAVITY LIGHT SOURCE WITH PNPN BLOCKING

(71) Applicants: University of Central Florida Research Foundation, Inc., Orlando, FL (US); sdPhotonics, LLC, Oviedo, FL (US)

(72) Inventor: Dennis G. Deppe, Oviedo, FL (US)

(73) Assignees: University of Central Florida Research Foundation, Inc., Orlando, FL (US); sdPhotonics, LLC, Oviedo, FL (US)

( * ) Notice: Subject to any disclaimer, the term of this patent is extended or adjusted under 35 U.S.C. 154(b) by 0 days.

(21) Appl. No.: 15/648,260

(22) Filed: Jul. 12, 2017

(65) Prior Publication Data

US 2018/0019572 A1 Jan. 18, 2018

Related U.S. Application Data

(60) Provisional application No. 62/467,514, filed on Mar. 6, 2017, provisional application No. 62/361,531, filed on Jul. 13, 2016.

(51) Int. Cl.
*H01S 5/00* (2006.01)
*H01S 5/183* (2006.01)
(Continued)

(52) U.S. Cl.
CPC ........ *H01S 5/18308* (2013.01); *H01S 5/2018* (2013.01); *H01S 5/2054* (2013.01);
(Continued)

(58) Field of Classification Search
CPC ...... H01S 5/3013; H01S 5/3201; H01S 5/323; H01S 5/18308; H01S 5/183; H01S 5/2018; H01S 5/2014
See application file for complete search history.

(56) References Cited

U.S. PATENT DOCUMENTS

| 5,226,053 A | 7/1993 | Cho et al. |
| 5,594,751 A | 1/1997 | Scott |

(Continued)

FOREIGN PATENT DOCUMENTS

| EP | 0317007 A1 | 5/1989 |
| JP | 2005051124 | 2/2005 |
| WO | 9750109 | 12/1997 |

OTHER PUBLICATIONS

L.A. Coldren, et al., "Diode Lasers and Photonic Integrated Circuits", John Wiley & Sons, Inc., 1995, Wiley Series in Microwave and Optical Engineering, p. 22.

(Continued)

*Primary Examiner* — Kinam Park
(74) *Attorney, Agent, or Firm* — Jetter & Associates, P.A.

(57) ABSTRACT

A semiconductor vertical light source includes an upper mirror and a lower mirror. An active region is between the upper and lower mirror. The light source includes an inner mode confinement region and outer current blocking region. The outer current blocking region includes a common epitaxial layer that includes an epitaxially regrown interface which is between the active region and upper mirror, and a conducting channel including acceptors is in the inner mode confinement region. The current blocking region includes a first impurity doped region with donors between the epitaxially regrown interface and active region, and a second impurity doped region with acceptors is between the first doped region and lower mirror. The outer current blocking region provides a PNPN current blocking region that includes the upper mirror or a p-type layer, first doped region, second doped region, and lower mirror or an n-type layer.

20 Claims, 6 Drawing Sheets

(51) Int. Cl.
   *H01S 5/32*   (2006.01)
   *H01S 5/323*  (2006.01)
   *H01S 5/20*   (2006.01)
   *H01S 5/30*   (2006.01)

(52) U.S. Cl.
   CPC .......... *H01S 5/3013* (2013.01); *H01S 5/3201* (2013.01); *H01S 5/323* (2013.01); *H01S 5/183* (2013.01)

(56) References Cited

U.S. PATENT DOCUMENTS

| | | | |
|---|---|---|---|
| 5,754,578 | A | 5/1998 | Jayaraman |
| 5,881,089 | A | 3/1999 | Berggren et al. |
| 6,563,141 | B1 | 5/2003 | Dawson et al. |
| 6,795,478 | B2 | 9/2004 | Hwang et al. |
| 8,774,246 | B1 | 7/2014 | Deppe et al. |
| 2001/0043636 | A1 | 11/2001 | Bewley et al. |
| 2002/0110196 | A1 | 8/2002 | Nguyen et al. |
| 2002/0176465 | A1 | 11/2002 | Kondow et al. |
| 2002/0191656 | A1 | 12/2002 | Mawst et al. |
| 2003/0164504 | A1 | 9/2003 | Kaneko |
| 2005/0063440 | A1 | 3/2005 | Deppe |
| 2005/0135450 | A1* | 6/2005 | Katsuyama ......... H01S 5/18308 372/50.1 |
| 2005/0249254 | A1* | 11/2005 | Deppe ................. H01S 5/18327 372/46.01 |
| 2008/0219307 | A1* | 9/2008 | Birkedal ................ H01S 5/183 372/44.01 |
| 2010/0265976 | A1 | 10/2010 | Bousquet et al. |
| 2010/0272145 | A1 | 10/2010 | Weichmann et al. |
| 2011/0150019 | A1 | 6/2011 | Leatherdale et al. |
| 2011/0280269 | A1 | 11/2011 | Chang-Hasnain et al. |
| 2014/0064315 | A1* | 3/2014 | Dummer ................ H01S 5/0261 372/50.124 |
| 2015/0086220 | A1 | 3/2015 | Warren |
| 2016/0072256 | A1 | 3/2016 | Seurin et al. |

OTHER PUBLICATIONS

Carl W. Wilmsen, et al., "Vertical-Cavity Surface-Emitting Lasers", Cambridge University Press, 1999, Fundamental Issues in VCSEL Design, pp. 44-49.

* cited by examiner

LOW RESISTANCE VERTICAL CAVITY LIGHT SOURCE WITH PNPN BLOCKING

CROSS REFERENCE TO RELATED APPLICATIONS

This application claims the benefit of Provisional Application No. 62/361,531 entitled "VERTICAL CAVITY DEVICES" filed on Jul. 13, 2016, and Provisional Application No. 62/467,514 entitled "LOW RESISTANCE VERTICAL CAVITY LIGHT SOURCE" filed Mar. 6, 2017, that are both incorporated by reference herein in their entireties.

STATEMENT REGARDING FEDERALLY SPONSORED RESEARCH

This invention was made with Government support under Phase III SBIR Contract No. W911NF-14-C-0088 awarded by the Department of Defense (DOD) funding agency, the Army Research Laboratory. The U.S. Government has certain rights in this invention.

FIELD

Disclosed embodiments relate to semiconductor vertical cavity diode light sources that include epitaxial heterostructures that include a cavity spacer, which provide transverse optical and electrical confinement in the optical cavities.

BACKGROUND

Vertical-cavity surface-emitting devices have generally used an oxide aperture to funnel current into small active volumes of their optical cavities. The oxide aperture has been successfully used to create an aperture close to the device's active region and produce high efficiency through both mode and current confinement. However oxide vertical-cavity surface-emitting lasers (VCSELs) are limited by internal strain, heat flow, and manufacturing non-uniformity in the oxide aperture size that results from the oxide formation.

RCLED's are described in U.S. Pat. No. 5,226,053. A RCLED is a light emitting diode (LED) that generates mainly spontaneous emission and generally operates without a distinct threshold. Resonant cavity light emitting diodes (RCLEDs) also use oxide apertures and operate in the spontaneous emission regime. Oxide-aperture RCLEDs suffer similar problems to oxide-aperture VCSELs due to high internal strain, self-heating, and manufacturing non-uniformity.

While the oxide aperture has been successfully used in many VCSEL devices, it has drawbacks due to its material differences between the oxide material used to form the aperture, and the surrounding semiconductor material. The oxide generally has a different thermal expansion coefficient than the oxide, and proceeds through a timed diffusion process that results in aperture size variation across a processed VCSEL wafer. The oxide aperture is also limited in where it can be placed in the vertical cavity to avoid or minimize material degradation and strain inherent in the oxide.

Other techniques such as buried tunnel junctions or proton implanted resistive regions have also been used to obtain current and mode confinement without the need for an oxide aperture. However the tunnel junction can lead to increased resistance and voltage drop at the high current density used for the vertical cavity light source. The proton implanted VCSEL suffers from the thick implanted region required to achieve electrical isolation, which also increases the electrical resistance. Poor optical mode behavior also results due to self-heating and minimal built-in optical guide for the lasing mode.

Therefore the technology of vertical cavity surface emitting devices has a remaining need for device that can provide epitaxial mode confinement, while being able to engineer the mode confinement, electrical injection, surface step height, and material quality in producing the device.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include vertical resonant cavity light sources, such as a VCSEL, RCLED, or a surface-emitting LED that includes impurity regions placed in its cavity spacer to control the electrical conductivity in and around an injection region to the light emission region of the device. A feature of disclosed structures is that the electrical conductivity is controlled by epitaxial confinement structures to provide very low electrical resistance under normal device operation by forming a PNPN blocking region in an outer current blocking region with a conducting channel in an inner mode confinement region. The light sources can use mirrors based on distributed Bragg reflectors (DBRs) that include epitaxial DBR heterostructure mirror layers and can include heterostructure cavity spacers. The upper mirror (or p-type layer above the active region) and lower mirror (or n-type layer below the active region) are combined with a p-doped region and n-doped region that all together form the PNPN current blocking region in the outer current blocking region to increase the current blocking while producing a low resistance current path to the active region in the inner mode confining region.

As used herein a "cavity spacer" is defined to be a cavity region that includes the active region where the field undergoes phase change to create the resonance condition of the vertical cavity. Typically the cavity spacer thickness will be approximately an integer number of half-wavelengths thickness. The cavity spacer generally may have an upper cavity spacer region and/or a lower cavity spacer region. For example, in a full wave cavity spacer the first mirror layer may be an AlGaAs layer that has an Al composition that is increased over the material of the cavity spacer. If the active region is placed near the center of the full-wave cavity spacer it will have an upper cavity spacer region and a lower cavity spacer region. In a half-wave cavity, in contrast, the first mirror layer may be an AlGaAs composition that is lower in Al composition than the cavity spacer. It is also possible that an active region is placed at the upper or lower edge of a cavity spacer, if properly designed to be close to a field intensity peak formed by the cavity spacer. Other materials systems using to fabricate vertical-cavity light sources such as AlGaN and GaN, or InAlGaAs with varying Al compositions, or non-Al bearing materials such as InGaAsP, etc., may also be used in similar fashions to those disclosed below.

Layers are disclosed below that may represent epitaxial material compositional layers of a given material, or collections of epitaxial material compositional layers grouped to perform one or more functions. For example, a DBR mirror layer is an epitaxial layer that will generally include various material compositional layers for their electronic properties while the collection of epitaxial material compositional layers serve as a single DBR mirror layer. This will generally be true, for example, for a quarter-wave optically thick mirror layer. The same may be and generally will be true for a cavity spacer layer, a current blocking layer, an active region layer, and what is referred to as a common epitaxial layer. A low index DBR layer as used herein refers to a DBR layer for which the weighted average within an optical field has on average a low index relative to an adjoining DBR layer that may on weighted average have a relatively high refractive index. These layers can be described respectively as relatively low refractive index layers or relatively high refractive index layers, or low index and high index layers respectively. Such layers in general will include epitaxial layers of compositionally graded materials, such as varying Al content for the case of AlGaAs or AlGaN. This is also true, for example, of cavity spacer layers and other layers that may be high index or low index layers.

Upper and lower and above and below are defined herein to account for which layer or interface is formed in regions relative to the substrate on which the light emitter is formed. Layers or interfaces referred to upper and above relative to another layer or interface are further from the substrate on which the light source is produced, than layers are interfaces that are referred to as lower or below relative to a layer or interface. The substrate in any case may ultimately be removed after completion of the epitaxial growth upon further processing of the epitaxial material used to form the light source.

The conducting channel defined herein may be a p-type conducting channel or an n-type conducting channel formed in the cavity spacer by processing that is performed at least partly outside an epitaxial growth system. The epitaxial growth is at least a two-step epitaxial growth with process steps performed at least partly outside the epitaxial growth system being used in-between the two epitaxial growth steps. The conducting channel can be formed using atom diffusion, ion implantation and activation, implantation and diffusion, or epitaxial growth, or similar approaches of introducing impurity atoms into the semiconductor in the region desired for the conducting channel. Impurity doped regions epitaxially grown into the cavity spacer and/or active region then form portion(s) of the current blocking region outside the conducting channel. Heterojunctions can be used to increase the blocking voltage and decrease capacitance by increasing the thickness of depleted regions that may exist between impurity regions. Grown-in doping profiles with low diffusion coefficients can meet requirements for depletion region widths to maintain p and n regions under forward bias for current blocking. Combining these depletion regions with heterojunctions enables PNPN current blocking outside the conducting channel, while maintaining high quality cavity spacer design for confining the laser's optical field.

The PNPN current blocking region includes a common epitaxial layer upon which device processing is performed between two epitaxial growth steps. The common epitaxial layer is defined herein as an epitaxial layer that includes at least one epitaxially regrown interface in the outer current blocking region. The common epitaxial layer extends over the outer PNPN current blocking region and extends over an internal mode confinement region. The common epitaxial layer also may include at least a portion of the conducting channel within its inner mode confinement region. The use of the common epitaxial layer enables high crystal quality while modifying shallow impurity profiles in the light source. The common epitaxial layer that exists in the outer current blocking region and in the inner mode confinement region, with at least a regrown interface in the outer current blocking region, enables the PNPN current blocking region to include the cavity spacer of the light source. The common epitaxial layer can include a shallow mesa within the inner mode confinement region to increase the optical mode confinement of the vertical cavity light source.

The common epitaxial layer is designed to match the optical properties of the remaining layers of the vertical-cavity light emitter. The common epitaxial layer may adjoin a cavity spacer layer, or a portion of such a layer. However, the common epitaxial layer should be designed so as not to disrupt the optical cavity mode of the light source. In this aspect its thickness and refractive index should be designed to produce necessary resonance for efficient operation of the light source.

Low cost manufacturing is also maintained by the reliance on epitaxial material properties in processing that can be deposited with high accuracy and quality. This enables the advanced materials that include diffusion layers and sacrificial layers that can be processed with high reproducibly. Diffusions or implants can be designed with precise dopant amounts to control diffusion extent. Simple low cost annealing steps can then be used to form the current blocking and conducting channel regions, and these can be maintained in-situ with the epitaxial growth processes.

Disclosed impurity profiles and heterojunctions of vertical cavity light sources enable the conducting channel and current blocking region to be formed using p and n impurity regions that can be formed very close to the active region, and even in the active region. The conducting channel can extend the length of the region of highest current density, in the cavity of the light source. The conducting channel length can thus be kept short to decrease electrical resistance and operating voltage of the device by utilizing fabrication methods of the disclosed light sources that maintain high epitaxial material quality in the active region and cavity spacer of the light source. The electrical injection through the short conducting channel can reduce the electrical resistance of the light source and can increase its efficiency, while maintaining high reliability and low capacitance. Reliance on shallow p and n impurities that can be introduced with minimal defects enable very high material quality to be maintained. Semiconductor vertical-cavity light sources that include the conducting channel with index guides are also disclosed.

Disclosed embodiments include a semiconductor vertical light source including an upper p-type mirror or upper p-type layer, and a lower n-type mirror or lower n-type layer. An active region is between the upper and lower mirror. The light source includes an inner mode confinement region and outer current blocking region. The outer current blocking region includes a common epitaxial layer that includes an epitaxially regrown interface that is between the active region and upper mirror, and a conducting channel including acceptors is in the inner mode confinement region. The current blocking region includes a first impurity doped region with donors between the epitaxially regrown interface and active region, and a second impurity doped region with acceptors is between the first doped region and lower mirror. The outer current blocking region provides a PNPN current blocking region that includes the upper mirror or a p-type layer above the active region, first doped region, second doped region, and lower mirror or an n-type layer below the active region.

DETAILED DESCRIPTION

Figure 1:
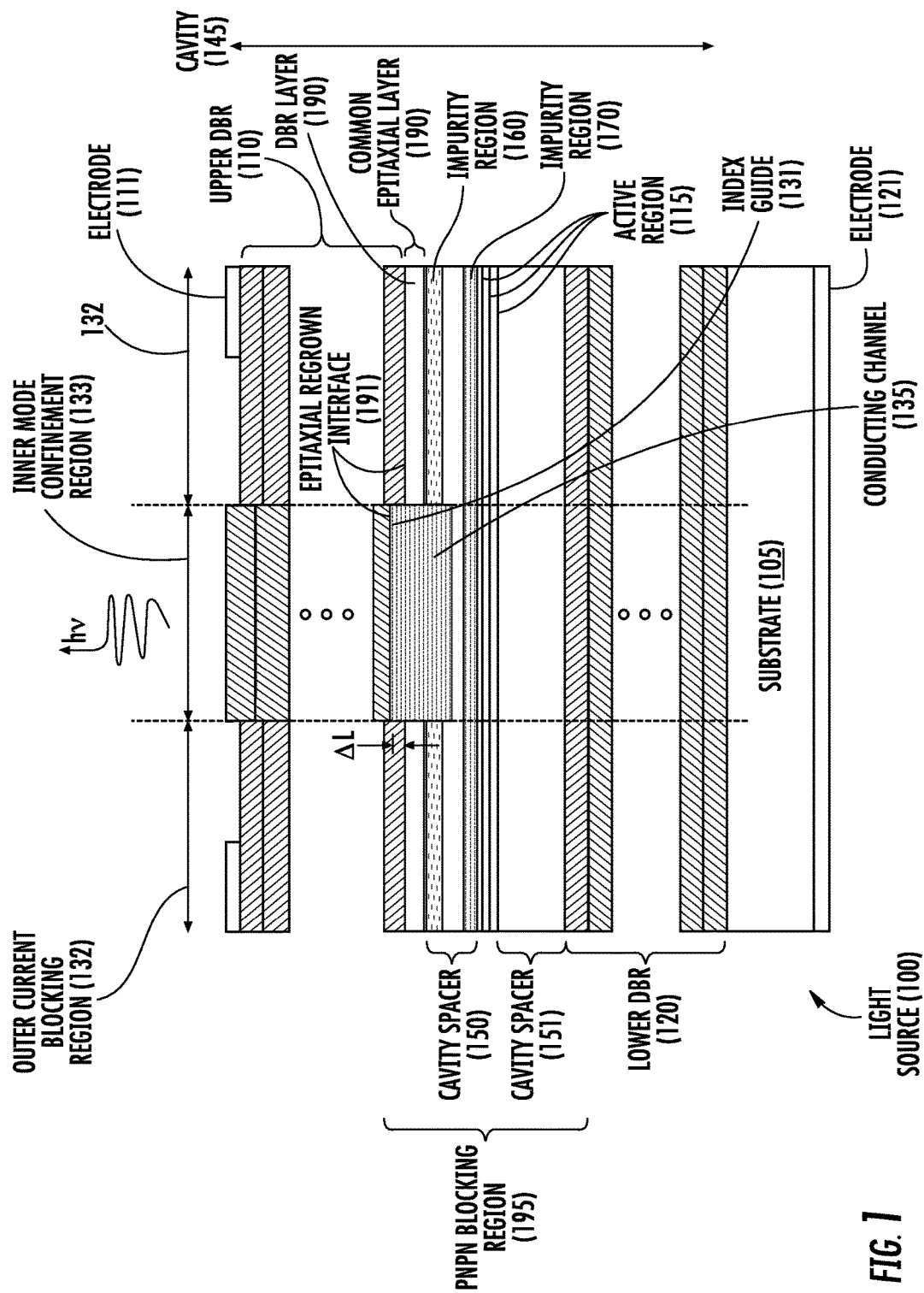
FIG. 1 is a schematic cross sectional diagram of an example semiconductor vertical cavity diode light source that includes a common epitaxial layer, and impurity doped regions of the cavity spacer.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed semiconductor light sources provide current blocking regions or conducting channels that include cavity spacers of vertical cavity light sources. These current blocking and conducting channel regions can be fabricated using combinations of epitaxially grown-in and diffused and/or implanted impurities that retain high material quality upon processing and epitaxial regrowth steps. Placing the current blocking region and the conducting channel in the cavity spacer can shorten the distance for which hole current should travel at approximately its highest current density. In addition, the disclosed PNPN current blocking regions formed normal to the growth plane can limit current spreading in the cavity spacer to reduce threshold and increase slope efficiency.

FIG. 1 shows a schematic cross sectional diagram of an example semiconductor vertical cavity diode light source 100 that includes an epitaxial index guide shown as an 'index guide' 131 with a conducting channel 135 in the inner mode confinement region 133, and an outer current blocking region 132 that forces current flow through the index guide 131 and into the conducting channel 135 under normal device operation. Electrodes 121 and 111 are shown on the lower side of the substrate 105 and the top of the upper mirror shown as an upper DBR 110, respectively, but these electrodes can have different configurations. The substrate 105 can comprise a GaAs substrate. Alternatively, the substrate 105 may comprise other III-V compound semiconductors such as GaN or InP, or another substrate of suitable material for fabricating a vertical cavity light source diode. The electrodes 111, 121 may be placed within the DBR mirror layers as well, for example.

The common epitaxial layer 190 facilitates fabrication through epitaxial regrowth. The common epitaxial layer 190 is designed to match the phase conditions needed to match the optical phase conditions of the light source. The upper DBR 110 includes the common epitaxial layer 190. The common epitaxial layer 190 is designed meet phase conditions needed between the cavity spacer layer 150 and the mirror layers of the upper DBR 110. The epitaxial regrowth interface 191 is shown in FIG. 1 in the outer current blocking region 132 between the common epitaxial layer 190 and the next upper adjoining layer of the upper DBR 110. The regrown interface 191 includes and forms the index guide 131 in the inner mode confinement region 133. By retaining the common epitaxial layer 190 also within the inner mode confinement region 133, very low optical scattering loss can be achieved in the light source 100. This contributes to high efficiency of light source 100. At the same time, the light source 100 fabrication uses conducting channel 135 fabricated in the same common epitaxial layer with the epitaxially regrown interface 191 provided by the common epitaxial layer 190 to provide efficient electrical injection into the active region 115. The common epitaxial layer 190 is thus included in the outer PNPN current blocking region 195 to provide electrical isolation, and in the inner mode confinement region that includes conducting channel 135 to provide low electrical resistance injection into the light source 100.

The epitaxial regrown interface 191 of the common epitaxial layer 190 can generally be identified by analytical techniques such as secondary ion mask spectroscopy (SIMS) used to measure dilute impurity concentrations, and/or transmission electron microscopy (TEM) imaging used to directly examine the structure in an image cross-section. Increased impurity content is generally collected from the fabrication performed between the two growth steps. The TEM imaging can trace the epitaxial regrown interface of the common epitaxial layer 190 between the outer current blocking region 132 and the inner mode confinement region 133 to approximately determine the height of the step ΔL. It can also be identified through the impurity profiles that exist in the outer current blocking region 132 and the inner mode confinement region 133 within the PNPN blocking region 195. These impurity profiles require the common epitaxial layer 190 and regrowth interface 191 to properly place them in the PNPN structure.

Optical scattering is reduced by minimizing ΔL to only a small fraction of a quarter thickness relative to the wavelength of the light source's 100 light emission. For example, at a wavelength of 990 nm and considering a light source 100 produced on a GaAs substrate 105, and AlGaAs upper and lower DBR layers corresponds approximately to a ~700 Å. Values of ΔL<<700 Å can thus produce low optical scattering loss within the inner mode confinement region 133. Yet even values of ΔL>25 Å can produce effective mode confinement and also increase the efficiency of the light source 100. Values of ΔL<250 Å can produce tight confinement of the optical mode to the inner mode confinement region 133, even for small confinement regions.

The PNPN current blocking region 195 including the common epitaxial layer 190 and the regrown interface 191 includes the p-type upper DBR 110, a first n-type impurity region 160 and a second p-type impurity region 170, and the n-type lower DBR 120. The PNPN blocking region 195 is formed by p-doping of upper DBR 110, n-type impurity region 160, p-type impurity region 170, and lower n-doped mirror 120. There are undoped depleted regions in-between these doped regions. The optical design of the cavity 145 including the upper DBR 110 and lower DBR 120, cavity spacer layers 150 and 151, and active region 115 are combined with first impurity doped region 160 and second impurity doped region 170 to form the PNPN current blocking region 195. In order to insure sufficient blocking for efficient device operation, the first and second impurity doped regions 160 and 170 are chosen with sufficient impurity concentrations to limit total depletion widths and prevent charge transport through the PNPN current blocking region 195 that exists in the outer current blocking region 132, under normal device operation.

As describe above, the first and second impurity regions 160 and 170 are shown in the cavity spacer layer 150, and together with doped regions in upper DBR 110 and lower DBR 120 form the PNPN current blocking region 195. Therefore the layers of the cavity spacer 150 and 151, and active region 115, are used for current blocking and optical mode confinement. In FIG. 1 the common epitaxial layer 190 of upper DBR 110 above the cavity spacer 150 includes no intentional doping. The adjoining DBR layer in upper DBR 110 that also includes regrown interface 191 and what may be one or more subsequent DBR layers are intentionally doped with grown in impurities (acceptors) to maintain p-type conductivity. First impurity region 160 is a donor impurity to form an n-type region just below common epitaxial layer 190. The first impurity region 160 may be implanted and activated, or epitaxially grown-in. It is also possible that the first impurity region 160 be located in the common epitaxial layer 190, and can be implanted, epitaxially grown-in, or diffused.

The donor impurity concentration in the first impurity region 160 should be sufficiently high to avoid depletion, or when depleted should retain sufficient current blocking. Second impurity region 170 is also formed, ideally by a grown-in acceptor impurity region, and placed close to the active region 115 at the center of the cavity spacer. The second impurity region 170 may modulation dope the active region 115 so that active region 115 includes excess equilibrium hole charge. As with donor doping in the first impurity region 160, acceptor doping in the second impurity region 170 generally includes a sufficient acceptor concentration to maintain p-type conductivity to achieving high blocking voltage in the outer current blocking region 132. Lower DBR 120 is doped with donor impurities and completes the PNPN current blocking region 195.

The formation of the first acceptor doped region that forms the upper p region of the PNPN above the regrown interface 191 of the common epitaxial layer 190 can create a double heterostructure barrier between the first p region of the upper DBR 110 and the first n region that is the donor doping of the first impurity region 160. The double heterostructure formed by the common epitaxial layer 190 can therefore suppress hole injection into the current blocking region 195, which increases the blocking voltage of the PNPN blocking region 195. It is noted that the common epitaxial layer 190 may be acceptor doped or donor doped and maintain the PNPN blocking. However, along with reduced leakage current, an undoped common epitaxial layer 190 can add to the total depletion thickness, reduce electrical capacitance, and ease the formation of conducting channel 135 compared to the case that the common epitaxial layer 190 is donor doped.

Placing the p-type doped second impurity region 170 below the donor doped first impurity region 160 above and in close proximity to the active region 115 also uses the heterostructure active region to suppress electron injection from lower DBR 120 into the current blocking region 195. Suppressing both electron injection from lower DBR 120 and hole injection from the upper DBR 110 can then be used to produce a large blocking voltage and achieve efficient electrical injection, even for small active area vertical cavity light sources.

Conducting channel 135 can be formed by either diffusion of acceptors, implantation of acceptors, or implantation and diffusion of acceptors impurities. Conducting channel 135 can also be formed through grown-in acceptor impurities if the common epitaxial layer 190 is also acceptor doped. The conducting channel 135 formed by introducing the acceptors selectivity into a grown-in first impurity region 160 containing donor impurities that may also exist in the inner mode confinement region 133 counter-dopes this region in cavity spacer 150 and converts it from n-type conductivity to p-type conductivity within the inner mode confinement region 133 and conducting channel 135. Diffusion of column II acceptors such as Be, Zn, or Mg especially can create this dopant type conversion while retaining high material quality that enables the diffusion to be performed in the cavity spacer. These column II impurities can be epitaxially grown-in to sacrificial layers, and then patterned after growth to form selective acceptor diffusion sources. Or alternatively, the acceptor impurities can be implanted into a surface layer of the III-V epitaxial structure and subsequently annealed and diffused. The acceptor diffusion may also be performed from an external source, such as a vapor source.

The column II acceptors are generally preferable since they have relatively high diffusion coefficients at sufficiently low temperatures for the semiconductor crystal that can limit causing defects. The column II acceptors diffuse through a substitutional/interstitial mechanism that can be performed at temperatures generally between 550° C. and 700° C.

On the other hand column IV acceptors such as carbon have much lower diffusion coefficients, and thus remain stable in the lattice at high temperature. Carbon may be preferable to use if the common epitaxial layer 190 and the conducting channel 135 include grown-in acceptors in the second impurity region 170 desired for p-type conductivity to form the current blocking region 195. The p-type conducting channel 135 can then be formed between subsequent epitaxial growth steps through diffusion and/or ion implantation of the donor impurity region 160.

FIG. 1 also shows that the index guide 131 can use a step in the crystal surface of height □L between the inner mode confinement region 133 and the outer current blocking region 132. This step height may formed by etching a surface layer to transfer the pattern into the starting epitaxial surface. For example, a high concentration of acceptor impurities may be grown into a thin surface layer on the common epitaxial layer 190, and then removed along with its impurities from regions that become the current blocking region 195. It may also be a high concentration of acceptor impurities are implanted in a blanket coverage, again with the implant designed to maintain the acceptors mainly in a thin layer above the common epitaxial layer 190. This thin layer can again be patterned and removed outside the index guide 131.

Alternatively, implanting selectively only into the region of the index guide 131 can also be performed, with implant conditions set to minimize damage of the crystal. This can be achieved because only very shallow implants are needed. Thus conducting channel 135 can be formed again minimizing defects that may be created in its formation.

The second impurity region 170 is doped ideally with grown-in acceptor impurities that can be placed close to the active region 115, with its thickness minimized so that a depletion region easily forms between it and the first impurity region 160. First impurity region 160 may receive donor doping of ~$10^{17}$ to ~$5 \times 10^{19}$ cm$^{-3}$ or greater, depending on its thickness and surrounding regions. The conducting channel 135 need only extend through the donor doped first impurity region 160 to form the injection path into the active region 115. However extending it to reach a carbon doped second impurity region 170 or even into the active region 115 can reduce electrical resistance in the vertical cavity light source 100.

It can also be desirable to minimize the donor impurity in the first impurity region 160, since the donor impurities may also exist in the conducting channel 135 if the donor impurities are grown-in. If the first impurity region 160 is implanted the implantation will also create damage. Though this damage is reduced through use of low implant energy, low dose and annealing, these donor impurities may reduce hole mobility in the conducting channel 135 within inner mode confinement region 133 that overlaps the first impurity region 160. Therefore minimizing the donor concentration while maintaining sufficient current blocking in PNPN region 195 can reduce the electrical resistance of the light source.

It may also be that a minimum concentration of donor impurities in the first impurity region 160 is needed to overcome an unintentionally high background of acceptor impurities. Typically, the conducting channel 135 comprises acceptor impurities with concentration of ≥$5 \times 10^{16}$ cm$^{-3}$, and may be ≥$5 \times 10^{18}$ cm$^{-3}$. More generally the conducting channel acceptor concentration chosen to generate a hole charge concentration of ~$5 \times 10^{17}$ cm$^{-3}$ to ~$2 \times 10^{18}$ cm$^{-3}$ through much of its extent. In this case donor impurity region 170 doped with donors may include a donor impurity concentration of $10^{17}$ cm$^{-3}$ to $10^{19}$ cm$^{-3}$. Spacing the first impurity doped region 160 and second impurity doped region 170 as shown in FIG. 1 with undoped region(s) in between also reduces the impurity concentrations needed to form the PNPN blocking region 195.

Figure 2:
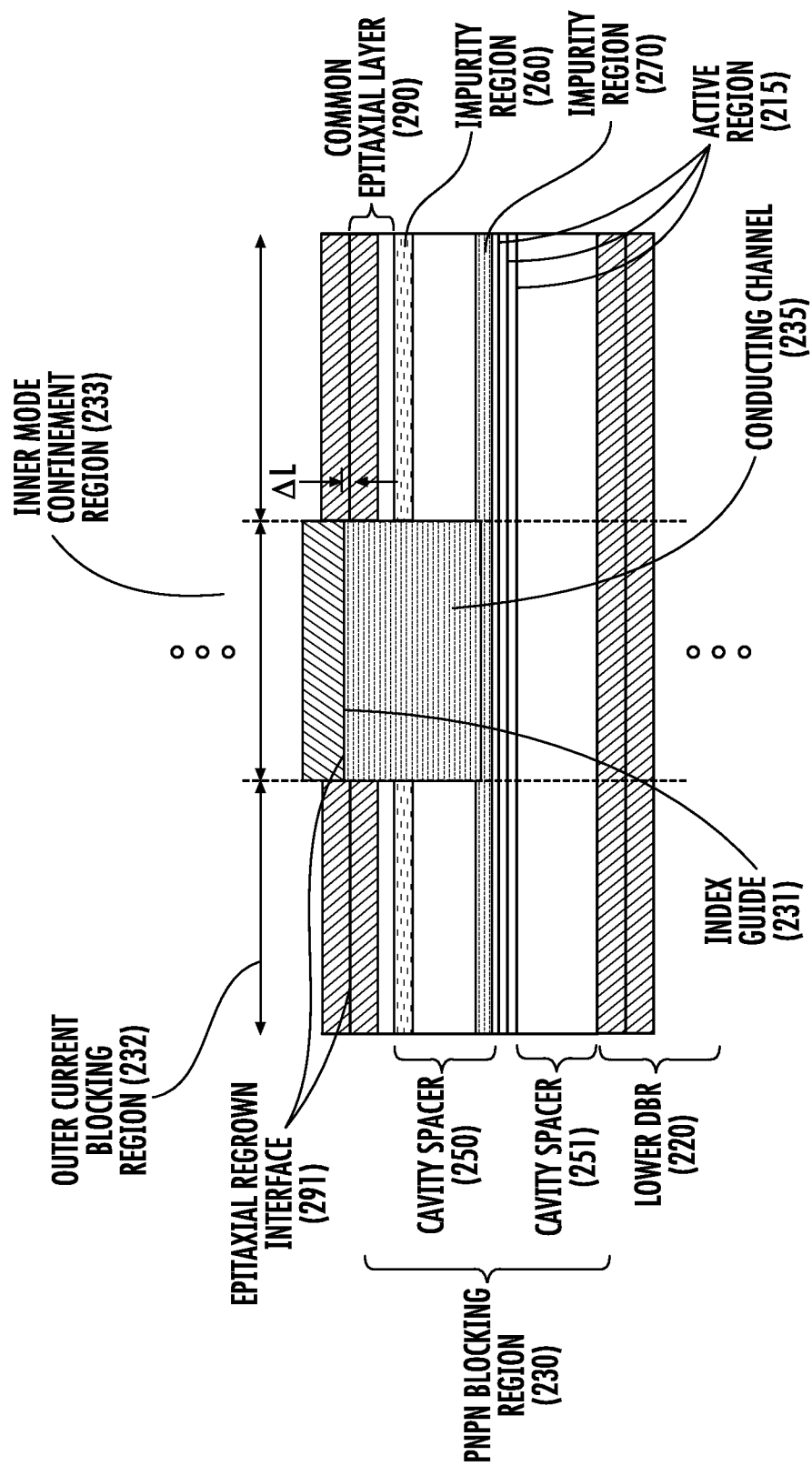
FIG. 2 is a schematic cross sectional diagram of an expanded view of impurity doped regions in the cavity spacer and upper and lower DBR mirror pairs closest to the cavity spacer.

FIG. 2 shows a second vertical-cavity light source embodiment (only partially shown) for which the common epitaxial layer used for epitaxial regrowth 290 is now partially doped with an acceptor. An index guide 231 can be formed in the inner mode confinement region 233 as shown and as in FIG. 1. Lower DBR 220 is doped n-doped. The donor doped first impurity region 260 is formed below the common epitaxial layer 290, and the regrown interface 291 exists between the common epitaxial layer 290 and the acceptor doped second impurity region 270 is formed next to the active region 215. In addition, the conducting channel 235 is formed fully extending into the cavity spacer 250 and into the acceptor doped second impurity region 270. Carbon is a desirable acceptor impurity that can be epitaxially grown into the crystal and maintains a low diffusion coefficient at high crystal temperature. Conducting channel 235 can be diffused from grown in acceptor impurities such as Zn, Be, or Mg, or such impurities can be implanted and the crystal annealed. Diffusion in general will also occur when the acceptor impurities are implanted and the crystal annealed, especially with column II acceptors that have substitutional-interstitial site changes that occur relatively easily in the diffusion process.

The PNPN current blocking region (PNPN blocking region) 230 in this case can include depleted regions due to light or no intentional impurity doping between first impurity region 260 and second impurity region 270, and between the first impurity region 260 and the doped region in the common epitaxial layer 290. The lower DBR 220 that is n-doped completes the PNPN blocking region 230 that produces current blocking and is contained in the outer current blocking region 232. For example, a depletion width for GaAs material that uses p and n doping at concentrations of $10^{18}$ cm$^{-3}$ on each side in an abrupt junction has a depletion width at room temperature of ~650 Å. Therefore abrupt junctions placed in the cavity spacer 250 can be used to produce current blocking. The thickness of cavity spacer 250 may be ~900 Å to ~1500 Å for arsenide based vertical cavity light sources, so that this doping level can provide current blocking without depleting the first and second impurity regions 260 and 270. Higher doping levels and/or the use of heterojunctions may be used if needed to increase the current blocking and for nitride vertical cavity light sources, for example, that operate with shorter wavelength and thus thinner cavity spacers. Lower doping levels may also be used for longer wavelength vertical-cavity light sources or longer cavity light sources that use thicker cavity spacer layers.

For forming the conducting channel 235 it can be an advantage to keep the first impurity region 260 that includes donor impurities thin, or with some doping gradient. This can ease the fabrication process to form the conducting channel 235 through the common epitaxial layer 290 and into the cavity spacer 250. The common epitaxial layer 290 can remain partially depleted to increase the blocking voltage by limiting hole injection into the PNPN blocking region 230. A heavily doped upper region of the common epitaxial layer 290 can help however to funnel current into the conducting channel 235. Because the hole current should funnel to its minimum in much of the conducting channel 235, its current funneling properties can decrease the device resistance.

Index guide 231 may be formed by selective etching of GaAs, InGaAs, and AlGaAs, for example, if the vertical cavity light source is an arsenide-based device. It could also be a nitride or phosphide device, or potentially from other semiconductor materials. For a nitride-based device the selective etching can be of GaN, InGaN, or AlGaN, for example. For a phosphide-based device (e.g., an InP substrate) the materials may be InGaAsP, InGaAs, or InGaAlAs. Selective etching and reliance on the common epitaxial layer 290 through which the conducting channel 235 is formed can improve fabrication and yield. Conducting channel 235 can be formed by diffusing an impurity from a selectively etched crystal region that contained a high concentration of grown-in acceptor impurities just after crystal growth and had this highly doped region removed in the outer current blocking region 232. A shallow crystal surface step can be formed in this case, and provide optical mode confinement.

The conducting channel 235 may also have been formed for example from an implanted region, and this implant could have been a blanket implant covering the crystal surface, or a selective implant due to masking. If the conducting channel 235 is formed from a blanket implant, and the implant is shallow to remain close to the crystal surface, the implanted region can be removed by etching in the regions outside the conducting channel and subsequently diffused. The index guide 231 with a non-zero crystal step can be formed in this case.

Alternatively, the conducting channel 235 may be formed from a selective implant of acceptor impurities only into the inner mode confinement region 233. There may or may not be a surface step formed in this case, giving the possibility that the index step 235 may have a $\Delta L=0$. A zero index guide can help to select single mode operation.

Figure 3:
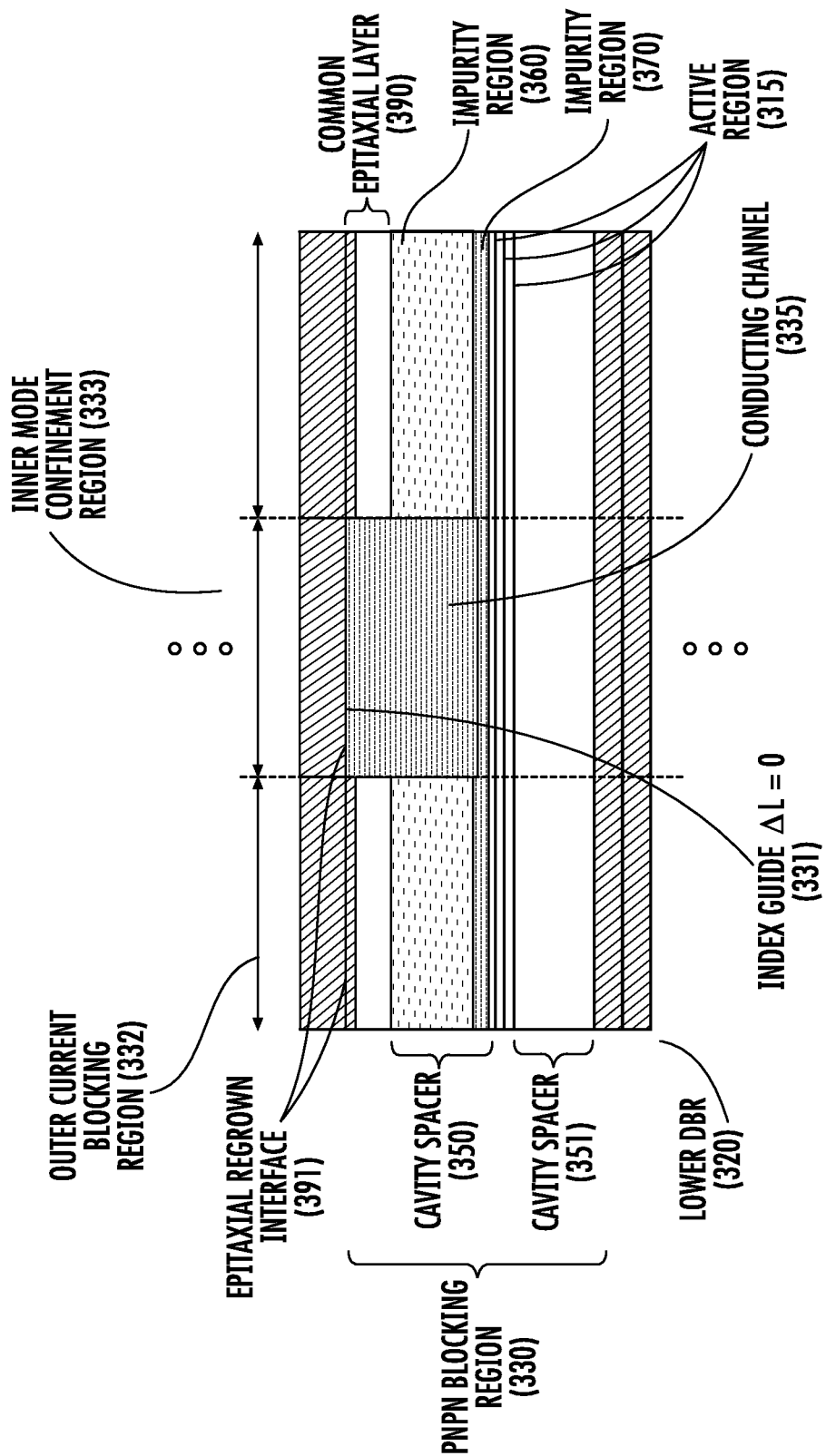
FIG. 3 is a schematic cross sectional diagram of an expanded view of impurity doped regions in the cavity spacer and upper and lower DBR mirror pairs closest to the cavity spacer.

FIG. 3 shows an example partial vertical-cavity light source for which the conducting channel 335 is formed through a thicker n-type first impurity region 360. In this case the n-type doping level of the first impurity region 360 is thicker and may be much lower concentration than, for example, the donor doping in the first impurity region 260 in FIG. 2. Common epitaxial layer 390 is also shown partially doped, which can reduce the electrical resistance of the light source. The epitaxially regrown interface 391 of the common epitaxial layer 390 is shown in FIG. 3. Index guide 331 can be formed using the same process described for FIG. 2 to form index guide 231, but with etch conditions used to leave a planar interface with $\Delta L=0$. Conducting channel 335 can be formed in most of the upper cavity spacer 350, while the lower cavity spacer 351 remains unintentionally doped in a significant part.

The first impurity region 360 can be designed with appropriate n-type doping level so that it remains at least partially undepleted, while at the same time the donor doping is sufficiently light so as to not limit mobility of holes in the conducting channel 335. Because more of the cavity spacer 350 includes first impurity region 360, than for the embodiment of FIG. 2, the impurity doping level can be reduced. This doping design can remain relatively lightly doped with donor impurities in first impurity region 360 and both eases the acceptor diffusion or activation of acceptor implants used to form conducting channel 335, and to maintain low impurity scattering in the conducting channel 335 relative for the acceptor doping level for the mobile hole charge. Thus the mobile hole charge can maintain higher mobility to produce a lower electrical resistance channel 335. If the donor impurity used to form first impurity region 360 is implanted, defects can be minimized because of the low energy implant that can be used, and the implanted region can require a less extreme anneal to activate the implant.

The PNPN blocking region 330 in the outer current blocking region 332 is formed by the common epitaxial layer 390 that is part of the upper p-type DBR, n-type first impurity region 360, p-type second impurity region 370, and the n-type lower DBR 320. Active region 315 may be undoped, though it may also include equilibrium hole charge due to modulation doping by the second impurity region 370. If the vertical cavity light source is a VCSEL, the inner mode confinement region 333 can force more preferential single mode lasing due to the index guide 331 having $\Delta L=0$.

Figure 4:
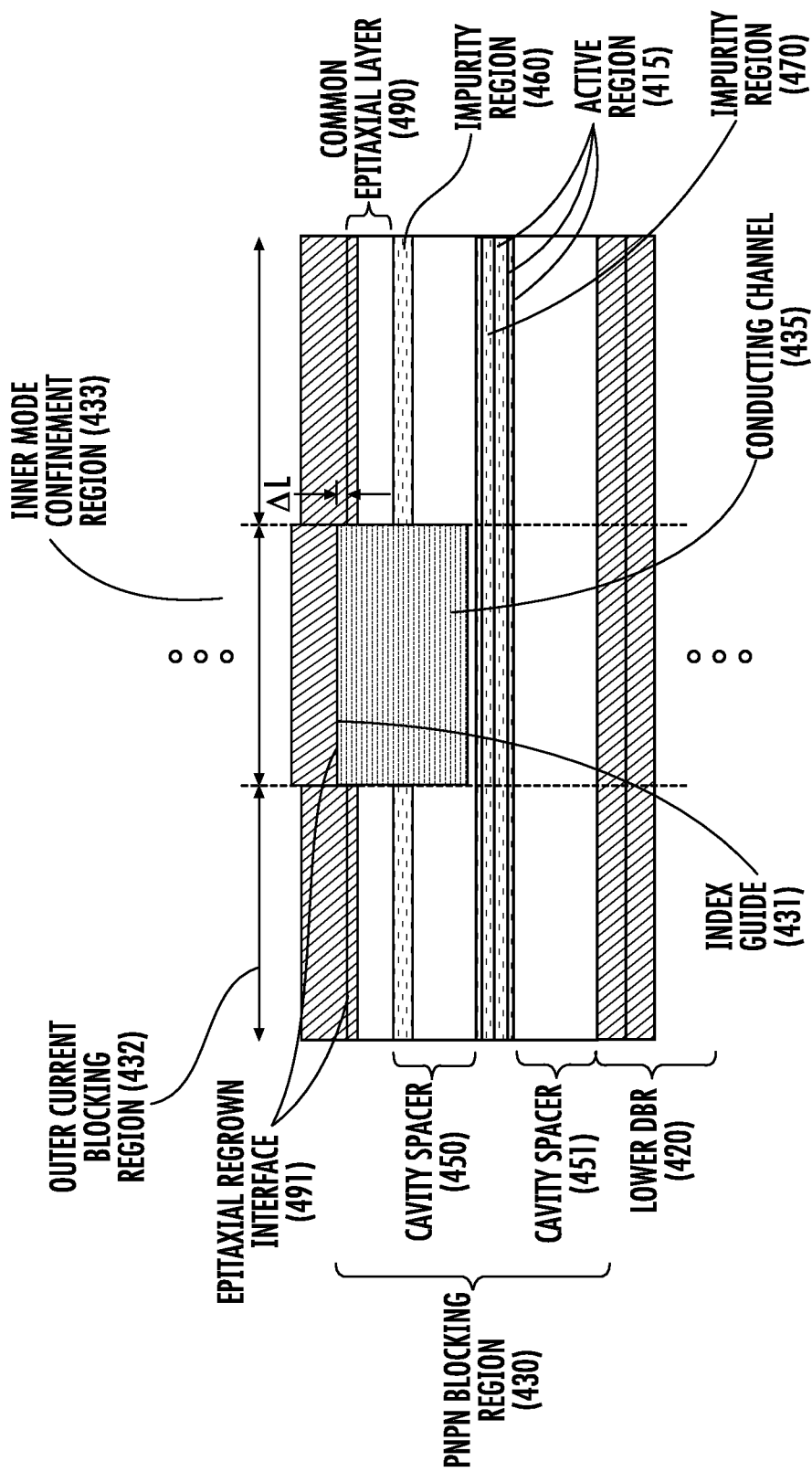
FIG. 4 is a schematic cross sectional diagram of an expanded view of impurity doped regions in the cavity spacer and upper and lower DBR mirror pairs closest to the cavity spacer.

FIG. 4 shows a partial vertical-cavity light source with further modifications in the design of the donor doped first impurity region 460 and the acceptor doped second impurity region 470. Second impurity region 470 is now moved into the active region 415 of the light source. The common epitaxial layer 490 is used for regrowth, and also shown with its epitaxially regrown interface 491. The PNPN blocking region 430 formed in the outer current blocking region 432 is formed by the acceptor doping in the common epitaxial layer 490, the donor doping of the first impurity region 460, the acceptor doping of the second impurity region 470, and the donor doping of the lower n-type DBR 420.

Conducting channel 435 is formed as described above for conducting channel 335 of FIG. 3, conducting channel 235 of FIG. 2, or conducting channel 135 of FIG. 1. The common epitaxial layer 490, and index guide 431 along with the electrical injection path of the conducting channel 435 form the mode confinement in the inner mode confinement region 433. Lower DBR 420 can be n-doped, and cavity spacer region 451 may also be n-doped or unintentionally doped. If the cavity spacer 451 is donor doped then the PNPN blocking region 430 would be formed by the acceptor doping of the common epitaxial layer 490, the donor doping of impurity region 460, the acceptor doping of the second impurity region 470, and donor doping sufficient to make the lower cavity spacer 451 n-type.

As in FIG. 3, heavily doping the common epitaxial layer 490 fully with acceptors can decrease the resistance of the vertical cavity light source by enabling more efficient current funneling into conducting channel 435. This current funneling is most important close to the cavity spacer so that current flowing with its highest current density (restricted to inner mode confinement region 433) has the shortest distance to flow.

Figure 5:
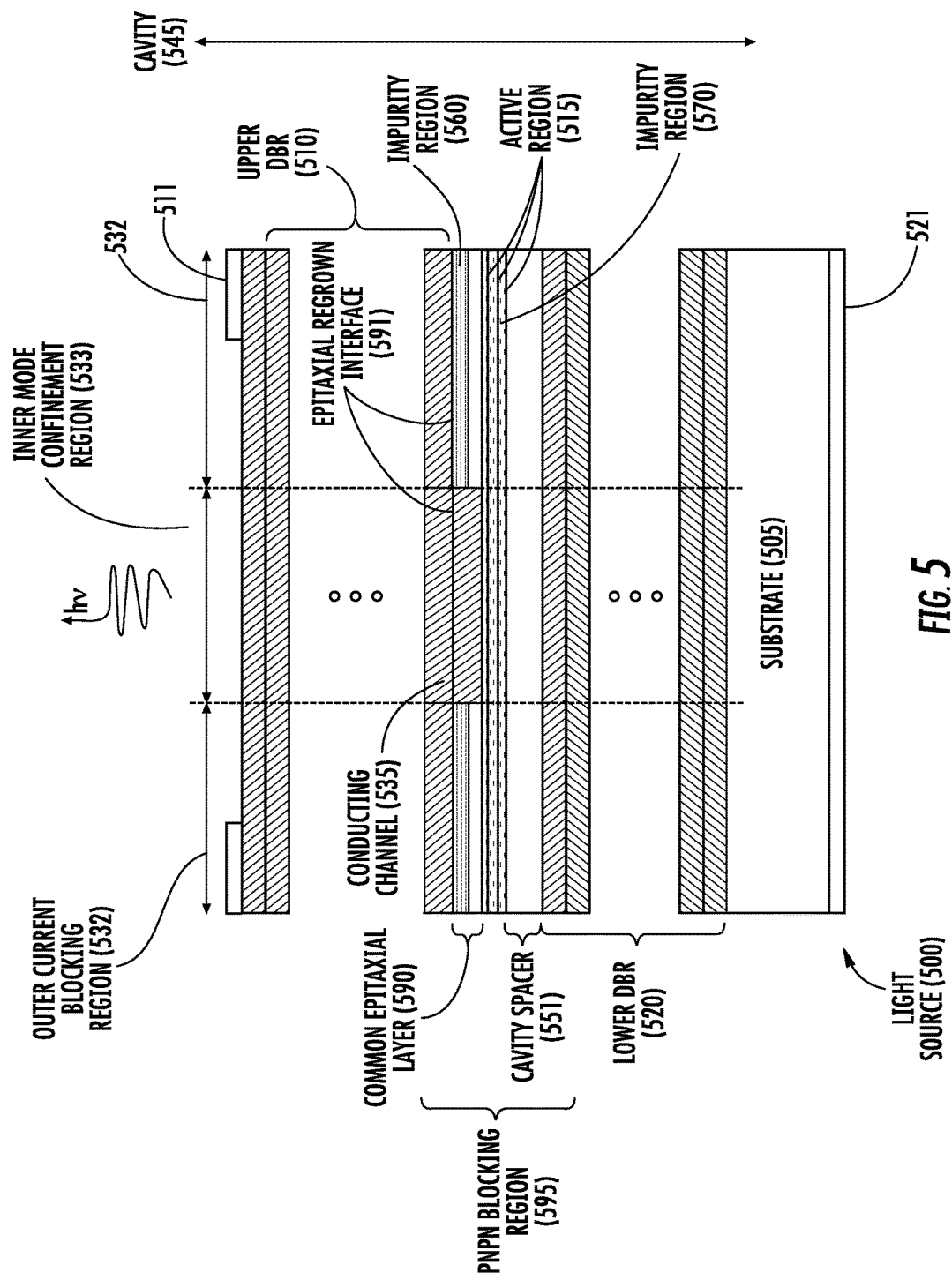
FIG. 5 is a schematic cross sectional diagram of impurity doped regions and layer structure in a half-wave cavity spacer of a vertical cavity diode light source.

FIG. 5 shows a schematic structure of a vertical-cavity light source 500 based on a half-wave cavity spacer for laser cavity 545. In this embodiment the common epitaxial layer 590 used for epitaxial regrowth is designed to provide resonance to form a half-wave cavity based on its spacers. The common epitaxial layer 590 is thus designed to match the optical phase conditions necessary to match the lower DBR 520, the lower cavity spacer 551, the active region 515, and the upper DBR 510. The common epitaxial layer shown in the embodiment of FIG. 5 has an optical thickness of approximately one-fourth wavelength in the material. Its design thickness depends on details of the surrounding layers. The epitaxial regrown interface 591 is shown in FIG. 5. Light source 500 uses a PNPN blocking region 595 in the outer current blocking region 532 including the common epitaxial layer 590. Conducting channel 535 can be formed through the common epitaxial layer 590 by acceptor diffusion, implantation, or implantation followed by diffusion of acceptor impurities, as well as by grown in acceptor impurities.

The index guide in this case can be maintained at a zero-index value, for which $\Delta L \sim 0$, or include other values of $\Delta L$. In this case the common epitaxial layer 590 is through which the conducting channel 535 is formed. The light source 500 is generally epitaxially grown on substrate 505 and includes lower electrode 521 and upper electrode 511. Impurity region 560 is a donor-doped region to produce n-type conductivity while the p-type second impurity region 570 is placed in the active region 515. The PNPN blocking region 595 is formed by the upper p-type DBR 510, the n-type first impurity region 560, the p-type second impurity region 570 and the lower n-type DBR 520. The use of half-wave cavity spacers can produce a shorter photon lifetime than the full-wave cavity spacer, and a short conducting channel 535.

Figure 6:
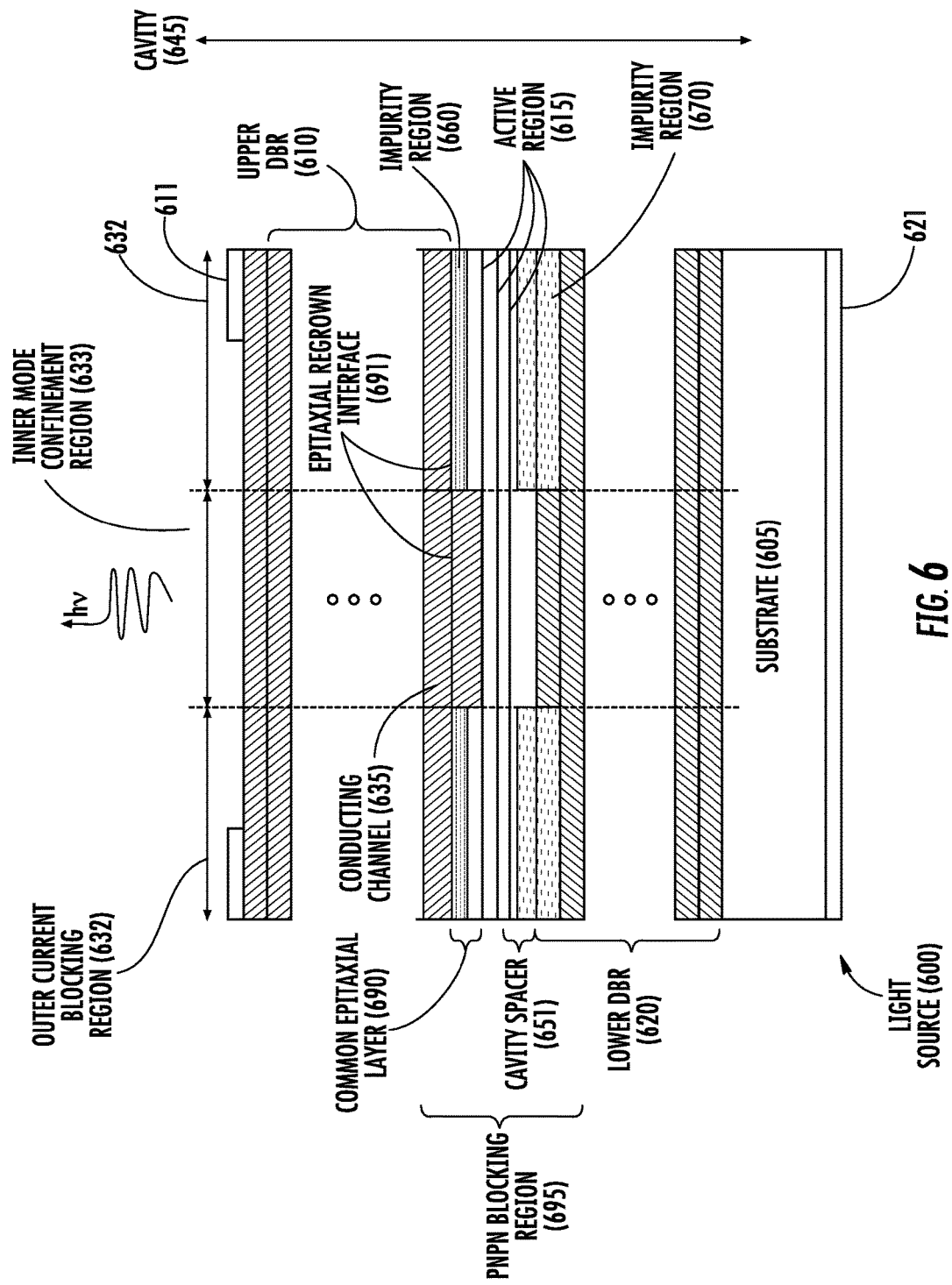
FIG. 6 is a schematic cross sectional diagram of impurity doped regions and a layer structure in a half-wave cavity spacer of a vertical cavity diode light source.

FIG. 6 shows a schematic structure of vertical-cavity light source 600 based on a half-wave cavity spacer for cavity 645. The common epitaxial layer is in the upper cavity spacer 690 used for epitaxial regrowth, and its regrown interface 691 is shown in FIG. 6. Light source 600 uses a substrate 605 on which is generally epitaxially grown a lower DBR 620, cavity spacer 651, active region 615, the common epitaxial layer 690, and upper DBR 610. Electrodes 621 and 611 are formed on the epitaxial materials for electrical contacting. Layer 690 forms a common epitaxial layer that includes conducting channel 635 and the donor doped first impurity region 660. The inner mode confinement region 633 can also include an index step an example ΔL, and in this case ΔL is assumed to be zero and not shown.

Acceptor impurity doping in the second impurity region 670 is now formed partially in the lower cavity spacer 651 and partially in the n-type DBR 620 in its first DBR layer adjoining cavity spacer 651. Second impurity region 670 is formed by an implantation to peak its concentration below the active region 615 as shown. The second impurity region 670 can be implanted and in general extend into the lower n-type DBR 620 as shown to increase the current blocking. Although different acceptors can be considered, beryllium has benefits including having a relatively light atomic mass to enable use of a reduced implant energy, and can be activated at relatively low annealing temperature. The PNPN blocking region 695 is formed by the upper p-type DBR 610, the donor doped first impurity region 660, the acceptor doped second impurity region 670, and the n-type portion in the outer current blocking region 632 of the lower n-DBR 620.

The donor doped first impurity region 660 can be formed through epitaxial growth, implanted, or diffused. If diffused, the diffusion can take place in the same epitaxial growth step following formation of the impurity regions through implantation and surface patterning in the epitaxial growth system. If donor doped first impurity region 660 is formed through epitaxial growth the conducting channel 635 may be formed by diffusion of an acceptor impurity or implantation, or implantation and diffusion.

The disclosed conducting channels and current blocking regions can be formed in half-wave cavity vertical cavity light sources, or other multiples of half-wave cavities. Both active region placement and impurity doping regions should be designed to account for the different structures. Techniques disclosed above can also form similar index guides in half-wave or other length optical cavities.

Further embodiments can make use of the disclosed conducting channels and current blocking regions that do not require a doped upper mirror or doped lower mirror. These structures may be desired to reduce optical loss or circumvent mirror layers that may otherwise cause high electrical resistance. For example, dielectric mirrors may be used in place of semiconductor mirrors, as long as one or more sufficiently doped layers are included above the epitaxial regrown interface of the common epitaxial layer, and one or more sufficiently doped layers are included below the vertical cavity light source's active region. In this way, the PNPN outer current blocking region can be formed without relying on any doped mirrors. Combinations such as an n-doped lower mirror and undoped upper mirror, or doped upper mirror and undoped lower mirror may be used, while retaining the PNPN blocking.

For example, if a cavity spacer layer below an active region is sufficiently n-doped, the lower DBR may be undoped or even dielectric layers to make the DBR. Use of the common epitaxial layer with its regrown interface, a p-doped layer above the regrown interface of the common epitaxial layer, and a first donor doped region and second acceptor doped region can implement a disclosed PNPN blocking current blocking region.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A semiconductor vertical resonant cavity light source, comprising:
an upper p-type mirror and a lower n-type mirror;
an active region for light generation between said upper mirror and said lower mirror;
said light source including an inner mode confinement region and an outer current blocking region;
said outer current blocking region comprising a common epitaxial layer that includes an epitaxially regrown interface extending over said inner mode confinement region and over said outer current blocking region which is between said active region and said upper mirror,
a conducting channel comprising acceptor impurities in said inner mode confinement region;
wherein said outer current blocking region provides a PNPN current blocking region comprising said upper mirror, a first impurity doped region comprising donor impurities between said epitaxially regrown interface and said active region, a second impurity doped region comprising acceptor impurities between said first impurity doped region and said lower mirror, and said lower mirror.

2. The light source of claim 1, further comprising at least one cavity spacer layer between said upper mirror and said active region.

3. The light source of claim 2, wherein said conducting channel electrically contacts said cavity spacer layer.

4. The light source of claim 2, wherein said conducting channel extends into said cavity spacer layer.

5. The light source of claim 1, wherein said conducting channel extends into said active region.

6. The light source of claim 1, wherein said common epitaxial layer comprises a distributed Bragg reflector (DBR) layer.

7. The light source of claim 1, wherein said lower mirror includes an acceptor doped region.

8. The vertical cavity light source of claim 1, wherein said light source comprises a vertical-cavity surface-emitting laser (VCSEL).

9. The light source of claim 1, wherein said second impurity region is included in at least part of said active region.

10. A semiconductor vertical resonant cavity light source, comprising:
an upper mirror and a lower mirror;
an active region for light generation between said upper mirror and said lower mirror;
said light source including an inner mode confinement region and an outer current blocking region;
said outer current blocking region comprising a common epitaxial layer that includes an epitaxially regrown interface extending over said inner mode confinement region and over said outer current blocking region which is between said active region and said upper mirror;
an upper p-type layer above said epitaxially regrown interface;
a lower n-type layer below said active region;
a conducting channel comprising acceptor impurities in said inner mode confinement region;
wherein said outer current blocking region provides a PNPN current blocking region comprising said upper p-type layer, a first impurity doped region comprising donor impurities between said epitaxially regrown interface and said active region, a second impurity doped region comprising acceptor impurities between said first impurity doped region and said lower n-type layer below said active region, and said lower n-type layer.

11. The light source of claim 10, further comprising at least one cavity spacer layer between said upper mirror and said active region.

12. The light source of claim 11, wherein said conducting channel electrically contacts said cavity spacer layer.

13. The light source of claim 11, wherein said conducting channel extends into said cavity spacer layer.

14. The light source of claim 10, wherein said conducting channel extends into said active region.

15. The light source of claim 11, wherein said common epitaxial layer comprises a distributed Bragg reflector (DBR) layer.

16. The light source of claim 11, wherein said lower mirror includes an acceptor doped region.

17. The light source of claim 10, wherein said light source comprises a vertical-cavity surface-emitting laser (VCSEL).

18. The light source of claim 10, wherein said second impurity region is included in at least part of said active region.

19. The light source of claim 1, further comprising a substrate comprising GaAs, GaN or InP that said light source is formed on.

20. The light source of claim 10, further comprising a substrate comprising GaAs, GaN or InP that said light source is formed on.

* * * * *